(12) United States Patent
Chen

(10) Patent No.: US 11,163,016 B2
(45) Date of Patent: Nov. 2, 2021

(54) LEAKAGE CURRENT SENSOR AND LEAKAGE CURRENT MONITORING DEVICE

(71) Applicant: Zhejiang Magtron Intelligent Technology Limited Cooperation, Jiaxing (CN)

(72) Inventor: Quan Chen, Jiaxing (CN)

(73) Assignee: Zhejiang Magtron Intelligent Technology Limited Cooperation

(*) Notice: Subject to any disclaimer, the term of this patent is extended or adjusted under 35 U.S.C. 154(b) by 51 days.

(21) Appl. No.: 16/076,118

(22) PCT Filed: Mar. 17, 2017

(86) PCT No.: PCT/CN2017/077033
§ 371 (c)(1),
(2) Date: Aug. 7, 2018

(87) PCT Pub. No.: WO2018/165970
PCT Pub. Date: Sep. 20, 2018

(65) Prior Publication Data
US 2021/0080512 A1 Mar. 18, 2021

(51) Int. Cl.
*G01R 31/52* (2020.01)
*G01R 1/44* (2006.01)
(52) U.S. Cl.
CPC .............. *G01R 31/52* (2020.01); *G01R 1/44* (2013.01)

(58) Field of Classification Search
CPC ................................. G01R 31/52; G01R 1/44
See application file for complete search history.

(56) References Cited

U.S. PATENT DOCUMENTS

| 2006/0247508 | A1* | 11/2006 | Fennell | G01R 31/50 600/345 |
| 2013/0151175 | A1* | 6/2013 | Streit | G01R 31/52 702/58 |
| 2013/0195288 | A1* | 8/2013 | Ye | H04R 19/005 381/111 |
| 2014/0047137 | A1* | 2/2014 | Mathason | G05B 19/0423 710/33 |
| 2017/0373630 | A1* | 12/2017 | Figie | H02P 29/0241 |

* cited by examiner

*Primary Examiner* — Dominic E Hawkins

(57) ABSTRACT

A leakage current sensor and a leakage current monitoring device; the leakage current center comprising an input end, an output end and an ASIC chip; the ASIC chip is electrically connected with the input end for reading analog quantity signals of the input end; the ASIC chip is further electrically connected to a digital signal processing module; the digital signal processing module can output digital quantity signals to the output end; the digital signal processing module can simultaneously feedback the output digital quantity signals to the ASIC chip, thereby forming a closed-loop feedback circuit; the input end of the leakage current sensor comprises a current sampling unit; a reference unit is arranged between the current sampling unit and the ASIC chip.

10 Claims, 3 Drawing Sheets

LEAKAGE CURRENT SENSOR AND LEAKAGE CURRENT MONITORING DEVICE

TECHNICAL FIELD OF THE INVENTION

The present invention relates to the technical field of current sensing, and more particularly, to a leakage current sensor and a leakage current monitoring device.

BACKGROUND OF THE INVENTION

Leakage current sensors are widely applied in various industries such as photovoltaic inverters, charging piles, rail signal monitoring, special power supply and fireproof monitoring. For instance, a leakage current sensor serves as a core protection component of a non-isolated photovoltaic inverter. However, traditional closed-loop flux gate sensors are no longer applicable due to their low power density degree, cumbersome structure and high cost.

Moreover, a leakage current sensor occupies too much space, as compared to other components in a photovoltaic inverter. Thus, it's difficult to achieve miniaturization and portability of an overall structural design.

To adapt to various current levels, leakage current sensors usually amplify a part of the sampling current. In a traditional technical solution, an amplification circuit is installed in the sensor, and the input and output of the circuit are both analog quantities. Due to the inherent characteristics of the amplifying circuit, the amplifying process has low precision. Even worse, noises are inevitably introduced into the aforesaid process, leading to a distorted output quantity.

Leakage current sensors are also an important safety component. In order to enhance their safety and reliability, functions such as self-checking and over-temperature protection are necessary during the electrifying and operating processes.

SUMMARY OF THE INVENTION

The purpose of the present invention is to solve the shortcomings in the prior art by providing a leakage current sensor, which is portable, intelligent and has a high power density degree.

To achieve the above purpose, the present invention adopts the following technical solution:

A leakage current sensor comprising an input end, an output end and an ASIC chip; the ASIC chip is electrically connected with the input end for reading analog quantity signals of the input end; the ASIC chip is further electrically connected to a digital signal processing module; the digital signal processing module can output digital quantity signals to the output end; the digital signal processing module can simultaneously feedback the output digital quantity signals to the ASIC chip, thereby forming a closed-loop feedback circuit; the input end of the leakage current sensor comprises a current sampling unit; a reference unit is arranged between the current sampling unit and the ASIC chip; the ASIC chip controls the reference unit to generate reference currents with different grades; the current sampling unit is used for sampling and acquiring the analog quantity of the reference current or the leakage current.

In another aspect of the present invention, the ASIC chip repeatedly sets a same reference current value for calibration, and reads the digital quantity signals fed back by the digital signal processing module, thereby forming the corresponding mapping between the analog quantity and the digital quantity of the reference current.

In another aspect of the present invention, the ASIC chip compensates the errors of the analog quantity signals of the leakage current according to aforesaid corresponding mapping, thereby outputting digital quantity signals.

In another aspect of the present invention, the ASIC chip has a preset programmable circuit, which can programmatically achieve the gain output of the digital quantity signals.

In another aspect of the present invention, the leakage current sensor further comprises a communication module, and the ASIC chip is electrically connected with the communication module. The communication module is connected with an external device for acquiring external control signals. The ASIC chip reads the aforesaid external control signals.

In another aspect of the present invention, the leakage current sensor further comprises a communication module, and the ASIC chip is electrically connected with the communication module. The communication module is connected with an external device for acquiring external control signals. The ASIC chip reads the aforesaid external control signals and adjusts the programmable circuit.

In another aspect of the present invention, the communication module reads the state signals sent by the ASIC chip and further forwards the signals to an external device, thereby achieving a bidirectional signal communication.

In another aspect of the present invention, the leakage current sensor further comprises a safety self-checking module and an over-temperature protection module, wherein the safety self-checking module and the over-temperature protection module are respectively electrically connected with the ASIC chip 120. The over-temperature protection module has a preset temperature upper limit.

In another aspect of the present invention, a leakage current monitoring device comprises the aforesaid leakage current sensor. The leakage current sensor comprises an input end, an output end and an ASIC chip. The ASIC chip is electrically connected with the input end for reading analog quantity signals of the input end. The ASIC chip is further electrically connected to a digital signal processing module. The digital signal processing module can output digital quantity signals to the output end. The digital signal processing module can simultaneously feedback the output digital quantity signals to the ASIC chip, thereby forming a closed-loop feedback circuit. The input end comprises a reference unit and a current sampling unit. The ASIC chip controls the reference unit to generate reference currents with different grades. The current sampling unit is used for acquiring the analog quantity of the reference current or the leakage current.

In another aspect of the present invention, the leakage current monitoring device comprises a base plate and an annular magnetic core that is fixedly connected with the base plate. The base plate is embedded in an outer shell, and the leakage current sensor is embedded in the base plate. A peripheral circuit and a plurality of lead feet are arranged on the periphery of the leakage current sensor. The lead feet are led from the peripheral circuit, and are further connected with an external device. The leakage current monitoring device comprises at least one bus bar, which is led from a monitored leakage current component, and penetrates through the annular magnetic core.

In another aspect of the present invention, the annular magnetic core is made from an amorphous strip material.

Compared with the prior art, the present invention has the following advantages:

The leakage current sensor of the present invention possesses functions such as programmable gain output, adjustable leakage current grade, digital quantity calibration, bidirectional signal communication, safety self-checking and over-temperature protection. Moreover, the adjustment of the current output can range from a milliampere level to an ampere level.

BRIEF DESCRIPTION OF THE DRAWINGS

To clearly expound the technical solution of the present invention, the drawings and embodiments are hereinafter combined to illustrate the present invention. Obviously, the drawings are merely some embodiments of the present invention and those skilled in the art can associate themselves with other drawings without paying creative labor.

MARKING INSTRUCTIONS OF THE DRAWINGS

Reference Unit 111, Current Sampling Unit 112, ASIC Chip 120, Digital Signal Processing Module 130, Communication Module 140, Safety Self-checking Module 150, Over-temperature Protection Module 160, Input End 101, Output End 102, Annular Magnetic Core 210, Base Plate 220, Bus Bar 230, Lead Foot 240, Outer Shell 250

DETAILED DESCRIPTION OF THE INVENTION

Drawings and detailed embodiments are combined hereinafter to elaborate the technical principles of the present invention.

Figure 1:
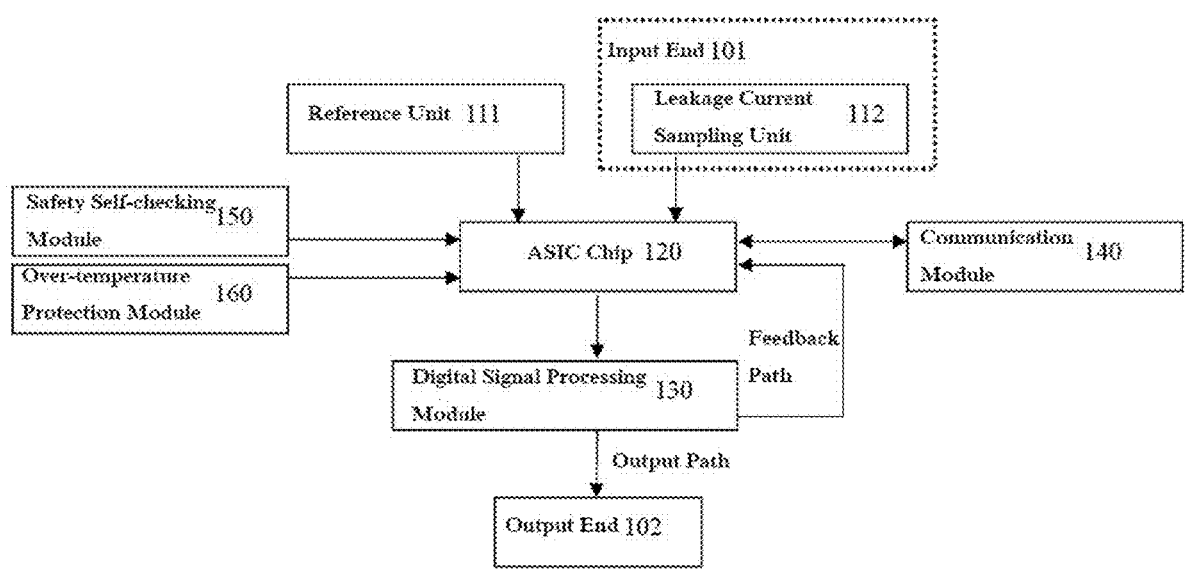
FIG. 1 is a structural diagram of the modules of the preferred embodiment of the present invention.

The present invention discloses a leakage current sensor and a leakage current monitoring device. FIG. 1 is a structural diagram of the modules of the leakage current sensor. As shown in FIG. 1, the leakage current sensor of the present invention comprises an input end 101, an output end 102 and an ASIC chip 120. The ASIC chip 120 is electrically connected with the input end 101 for reading analog quantity signals of the input end 101. The ASIC chip 120 is further electrically connected to a digital signal processing module 130. The digital signal processing module 130 can output digital quantity signals to the output end 102. The digital signal processing module 130 can simultaneously feedback the output digital quantity signals to the ASIC chip 120. Thus, a closed-loop feedback circuit can be formed, enabling the ASIC chip 120 to accurately calibrate the output gain.

Figure 2:
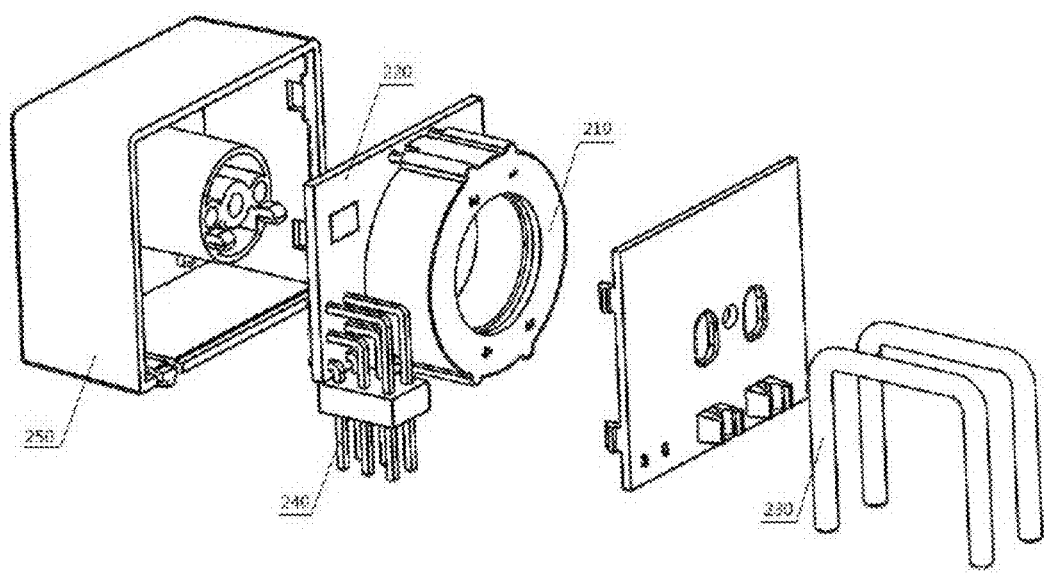
FIG. 2 is an explosive view of the preferred embodiment of the present invention.
Figure 3:
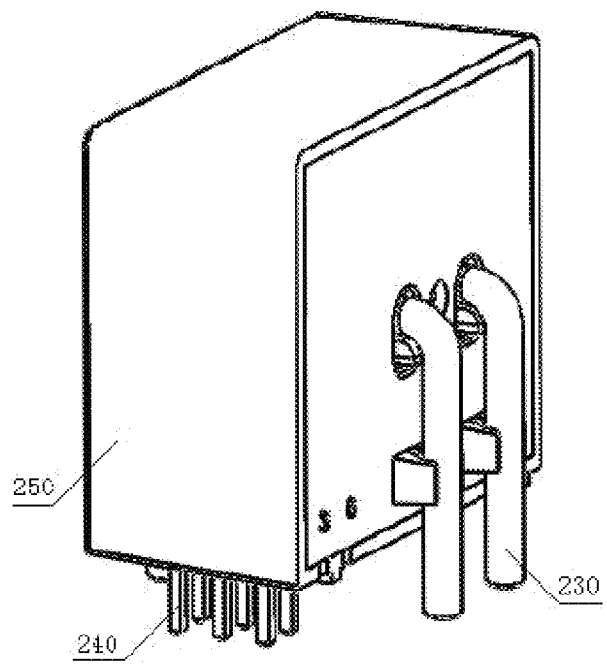
FIG. 3 is a partial structural diagram of the preferred embodiment of the present invention.

A breakdown structure of the leakage current monitoring device matched with the leakage current sensor is shown in FIGS. 2-3. The leakage current monitoring device comprises a base plate 220 and an annular magnetic core 210 that is fixedly connected with the base plate 220. The base plate 220 is embedded in an outer shell 250, and the leakage current sensor is embedded in the base plate 220. A peripheral circuit and a plurality of lead feet 240 are arranged on the periphery of the leakage current sensor. The lead feet 240 are led from the peripheral circuit, and are further connected with an external device. The leakage current monitoring device further comprises a bus bar 230 that is led from a monitored leakage current component. The bus bar 230 penetrates through the annular magnetic core 210.

Preferably, the input end 100 of the leakage current sensor comprises a current sampling unit 112. A reference unit 111 is arranged between the current sampling unit 112 and the ASIC chip 120. The reference unit 111 serves as a built-in excitation source, and high-precision currents with different grades such as 30 mA, 60 mA and 100 mA can be generated under the control of the ASIC chip 20. The current sampling unit 112 is used for sampling and acquiring the current analog quantity of the reference unit 111 or the bus bar 230.

Furthermore, the leakage current sensor is capable of calibrating the current digital quantity, outputting the programmable gain, and adjusting the leakage current grade. Preferably, the ASIC chip 120 presets a certain current value (e.g., 10 mA) for calibrating the digital quantity, and controls the reference unit 111 to generate a 10 mA reference current. The current sampling unit 112 samples the reference current, thereby obtaining a corresponding analog quantity. The ASIC chip 120 outputs the analog quantity of the reference current to the digital signal processing module 130. Subsequently, the digital signal processing module 130 reads the analog quantity of the reference current and converts the analog quantity into the digital quantity through a built-in circuit. The digital signal processing module 130 feeds back the obtained digital quantity of the reference current to the ASIC chip 120 through a feedback path. The ASIC chip 120 reads the aforesaid digital quantity of the reference current, and compares it with a reference current value used for calibration. The ASIC chip 120 repeatedly sets a same reference current value for calibration, and reads the digital quantity signals fed back by the digital signal processing module 130. Based on this, multiple sets of different reference current values can be set. Thus, the corresponding mapping between the analog quantity and the digital quantity of the reference current can be drawn, and a corresponding relation between the reference current value and the actual output value can be determined. Meanwhile, due to the inherent characteristics of the circuit, the current preset value and the actual output value cannot be completely consistent. Therefore, a small error cannot be avoided. When the current sampling unit 112 obtains the current analog quantity of the bus bar 230, according to the corresponding relation between the reference current value and the actual output value, the digital signal processing module 130 compensates the small error, and forcibly outputs an accurate digital quantity of the leakage current. Therefore, the calibration of the current digital quantity can be achieved.

$$V_{Out} = V_{ref} + V_{out} * \frac{GAIN}{PGA} \qquad \text{(Formula 1)}$$

According to above formula 1, when the digital signal processing module 130 outputs an accurate leakage current digital quantity for compensating the error, the digital signal processing module 130 directly outputs the leakage current digital quantity (Vout) to the output end 102 through an output path. Alternatively, the leakage current digital quantity (Vout) can be non-destructively amplified through a preset programmable circuit, thereby achieving an accurate gain output. Thus, the shortcoming of the traditional amplifying circuit that the error is synchronously amplified along the amplification of the analog quantity can be overcome.

Meanwhile, the programmable gain output of the digital quantity can be achieved, and the leakage current grade can be adjusted.

Moreover, the leakage current sensor achieves a bidirectional signal communication. The programmable gain output and the adjustable leakage current grade can be automatically or controllably realized. Preferably, the leakage current sensor further comprises a communication module 140, and the ASIC chip 120 is electrically connected with the communication module 140. The communication module 140 is connected with an external device for acquiring external control signals. After the aforesaid external control signals are read by the ASIC chip 120, the programmable circuit can be controlled and adjusted to adapt to different gain outputs and leakage current grades. Alternatively, the state signals sent by the ASIC chip 120 can be read by the communication module 140, and further forwarded to an external device, thereby achieving a bidirectional signal communication.

The leakage current sensor possesses a safety protection function during the electrifying and operating processes. Thus, the failure rate can be reduced, and the functional life can be prolonged. Preferably, the leakage current sensor further comprises a safety self-checking module 150 and an over-temperature protection module 160, wherein the safety self-checking module 150 and the over-temperature protection module 160 are respectively electrically connected with the ASIC chip 120.

When the leakage current sensor is electrified and initiated, the safety self-checking module 150 is preferentially awakened to check each module such as the digital signal processing module 130. After the checking process is completed, other modules are sequentially awakened according to a preset workflow. The over-temperature protection module 160 has a preset temperature upper limit. During the operation of the leakage current sensor, when the temperature monitored by the over-temperature protection module 160 is higher than the temperature upper limit value due to other reasons such as a short circuit of the bus bar, the over-temperature protection module 160 sends out an alarm signal according to the preset workflow. As a result, other protection measures (e.g., a forced outage) can be adopted, thereby effectively preventing the leakage current sensor from operating abnormally.

Preferably, the annular magnetic core 210 is made from an amorphous strip material, which is capable of significantly reducing the volume of the magnetic core and improving the power density.

In this embodiment, the leakage current sensor adopts a chip-level open-loop magnetic flux gate solution. Preferably, a current sensing chip is arranged in the leakage current sensor. The current sensing chip comprises a sensing unit that is connected with an IGBT output bridge arm. The current sensing chip further comprises a programmable gain unit, a temperature compensation unit, a zero correction unit and a control unit that is connected with the aforesaid three units. The sensing unit is sealed in the IGBT output bridge arm. The sensing unit comprises a detection lead wire and an even number of magnetic sensing subunits. The magnetic sensing subunits are arranged on the same plane in an array. The distances between the detection lead foot and each magnetic sensing subunit are equal. The output of each magnetic sensing subunit is sent out after a differential amplification. Through a magnetic-electrical coupling, the sensing unit of the leakage current sensor detects a magnetic field generated when the current flows through the chip, thereby forming a current signal. The magnetic field and the primary side current are in a linear proportion. After being adjusted by the programmable gain unit, corrected by the temperature compensation unit and rectified by the zero correction unit, an high-precision output of the current signal can be achieved under the control of the control unit.

The description of above embodiments allows those skilled in the art to realize or use the present invention. Without departing from the spirit and essence of the present invention, those skilled in the art can combine, change or modify correspondingly according to the present invention. Therefore, the protective range of the present invention should not be limited to the embodiments above but conform to the widest protective range which is consistent with the principles and innovative characteristics of the present invention. Although some special terms are used in the description of the present invention, the scope of the invention should not necessarily be limited by this description. The scope of the present invention is defined by the claims.

The invention claimed is:

1. A leakage current sensor, comprising:
   an input end,
   an output end, and
   an ASIC chip, wherein the ASIC chip is electrically connected with the input end for reading analog quantity signals of the input end, wherein the ASIC chip is further electrically connected to a digital signal processing module, wherein the digital signal processing module can output digital quantity signals to the output end, wherein the digital signal processing module can simultaneously feedback the output digital quantity signals to the ASIC chip, thereby forming a closed-loop feedback circuit, wherein the input end of the leakage current sensor comprises a current sampling unit, wherein a reference unit is arranged between the current sampling unit and the ASIC chip, wherein the ASIC chip controls the reference unit to generate reference currents with different grades, wherein the current sampling unit is used for sampling and acquiring the analog quantity of the reference current or the leakage current, wherein the ASIC chip repeatedly sets a same reference current value for calibration, and reads the digital quantity signals fed back by the digital signal processing module, thereby forming the corresponding mapping between the analog quantity and the digital quantity of the reference current.

2. The leakage current sensor of claim 1, wherein the ASIC chip compensates the errors of the analog quantity signals of the leakage current according to aforesaid corresponding mapping, thereby outputting digital quantity signals.

3. The leakage current sensor of claim 2, wherein the ASIC chip has a preset programmable circuit, which can programmatically achieve the gain output of the digital quantity signals.

4. The leakage current sensor of claim 3, wherein the communication module reads the state signals sent by the ASIC chip and further forwards the signals to an external device, thereby achieving a bidirectional signal communication.

5. The leakage current sensor of claim 1, wherein the ASIC chip has a preset programmable circuit, which can programmatically achieve the gain output of the digital quantity signals.

6. The leakage current sensor of claim 5, wherein the leakage current sensor further comprises a communication module, and the ASIC chip is electrically connected with the communication module, wherein the communication module is connected with an external device for acquiring external control signals, wherein the ASIC chip reads the aforesaid external control signals and adjusts the programmable circuit.

7. The leakage current sensor of claim 1, wherein the leakage current sensor further comprises a communication module, and the ASIC chip is electrically connected with the communication module, wherein the communication module is connected with an external device for acquiring external control signals, wherein the ASIC chip reads the aforesaid external control signals.

8. The leakage current sensor of claim 1, wherein the leakage current sensor further comprises a safety self-checking module and an over-temperature protection module, wherein the safety self-checking module and the over-temperature protection module are respectively electrically connected with the ASIC chip, wherein the over-temperature protection module has a preset temperature upper limit.

9. The leakage current monitoring device of claim 8, wherein the annular magnetic core is made from an amorphous strip material.

10. A leakage current monitoring device, comprising: the leakage current sensor of claim 1, a base plate, and an annular magnetic core that is fixedly connected with the base plate, wherein the base plate is embedded in an outer shell, and the leakage current sensor is embedded in the base plate, wherein a peripheral circuit and a plurality of lead feet are arranged on the periphery of the leakage current sensor, wherein the lead feet are led from the peripheral circuit, and are further connected with an external device, wherein the leakage current monitoring device comprises at least one bus bar, which is led from a monitored leakage current component, and penetrates through the annular magnetic core.

* * * * *